United States Patent [19]

Suzuki et al.

[11] Patent Number: 5,223,557
[45] Date of Patent: Jun. 29, 1993

[54] ELECTRONIC DEVICE SEALING RESIN COMPOSITIONS AND SEALED ELECTRONIC DEVICES

[75] Inventors: Keiichiro Suzuki; Yasuo Sakaguchi, both of Iwaki, Japan

[73] Assignee: Kureha Kagaku Kogyo K.K., Tokyo, Japan

[21] Appl. No.: 591,169

[22] Filed: Oct. 1, 1990

[30] Foreign Application Priority Data

Dec. 28, 1989 [JP] Japan .................. 1-338335
Jul. 5, 1990 [JP] Japan .................. 2-176438

[51] Int. Cl.$^5$ ............ C08K 3/34; C08F 283/10; C08F 283/12
[52] U.S. Cl. ................. 523/435; 525/523; 525/537; 524/265
[58] Field of Search ......... 524/265; 523/435; 525/523, 537

[56] References Cited

U.S. PATENT DOCUMENTS

| | | | |
|---|---|---|---|
| 4,370,292 | 1/1983 | Yanase et al. | 525/537 |
| 4,450,266 | 5/1984 | Idel et al. | 524/265 |
| 4,645,826 | 2/1987 | Iizuka et al. | 528/388 |
| 4,708,983 | 11/1987 | Liang et al. | 524/265 |
| 4,743,639 | 5/1988 | Liang et al. | 524/265 |
| 4,787,991 | 11/1988 | Morozumi | 252/12.4 |
| 4,797,448 | 1/1989 | Liang . | |
| 5,034,446 | 7/1991 | Kendall et al. | 524/265 |

FOREIGN PATENT DOCUMENTS

| | | |
|---|---|---|
| 0142825 | 5/1985 | European Pat. Off. . |
| 0369244 | 5/1990 | European Pat. Off. . |
| 0369652 | 5/1990 | European Pat. Off. . |
| 114784 | 8/1980 | Japan . |
| 9014 | 2/1981 | Japan . |
| 38856 | 3/1981 | Japan . |
| 17153 | 1/1982 | Japan . |
| 21844 | 2/1982 | Japan . |
| 40557 | 3/1982 | Japan . |
| 20910 | 2/1984 | Japan . |
| 20911 | 2/1984 | Japan . |
| 40188 | 9/1985 | Japan . |
| 7332 | 1/1986 | Japan . |
| 37482 | 2/1986 | Japan . |
| 197451 | 1/1987 | Japan . |
| 65351 | 3/1987 | Japan . |
| 62-127347 | 6/1987 | Japan . |
| 62-197451 | 9/1987 | Japan . |
| 63-17928 | 1/1988 | Japan . |
| 146963 | 6/1988 | Japan . |
| 219145 | 7/1988 | Japan . |
| 219146 | 9/1988 | Japan . |
| 63-219147 | 9/1988 | Japan . |
| 219147 | 9/1988 | Japan . |
| 1-185350 | 7/1989 | Japan . |
| 2-214774 | 8/1990 | Japan . |
| 2-229858 | 9/1990 | Japan . |

*Primary Examiner*—John C. Bleutge
*Assistant Examiner*—Helen F. Lee
*Attorney, Agent, or Firm*—Lowe, Price, Leblanc & Becker

[57] ABSTRACT

Disclosed herein are electronic device sealing resin compositions containing 100 parts by weight of a thermoplastic resin mixture composed of 25–60 wt. % of a poly(arylene sulfide) and 40–75 wt. % of an inorganic filler; and 1.5–5 parts by weight of an epoxy-modified silicone oil having an epoxy equivalent of 350–1,000 g/eqiv. Also disclosed are electronic devices sealed using such resin compositions.

5 Claims, No Drawings

ELECTRONIC DEVICE SEALING RESIN COMPOSITIONS AND SEALED ELECTRONIC DEVICES

FIELD OF THE INVENTION

The present invention relates to electronic device sealing resin compositions which have excellent moisture resistance. More specifically, the present invention is concerned with electronic device sealing compositions, each of which is obtained by blending an epoxy-modified silicone oil with a resin composition containing a poly(arylene sulfide) (hereinafter abbreviated as "PAS") as a resin component and also with sealed electronic devices obtained using the resin compositions.

BACKGROUND OF THE INVENTION

It is widely practiced to seal electronic devices, for example, transistors, diodes, ICs, capacitors and the like with a synthetic resin to retain their electrical insulating property and avoid variations in physical properties due to the surrounding atmosphere while enjoying its advantages in productivity, cost, etc.

Thermosetting resins such as epoxy resins and silicone resins have conventionally been employed as synthetic sealing resing. They are however pointed out to have drawbacks such that they require a long time for thermosetting and hence a long molding cycle, their storage is not easy because of the need for the prevention of the prematured progress of curing, and sprue runner slug cannot be reused.

Therefore, it has recently been proposed to use, as electronic device sealing resin compositions, resin compositions composed mainly of a polyphenylene sulfide (hereinafter abbreviated as "PPS") which is a thermoplastic resin having excellent heat resistance and flame retardance. Reference may be had, for example, to Japanese Patent Publication No. 9014/1981, Japanese Patent Application Laid-Open No. 17153/1982, Japanese Patent Application Laid-Open No. 21844/1982, Japanese Patent Application Laid-Open No. 40557/1982, Japanese Patent Application Laid-Open No. 20910/1984, Japanese Patent Application Laid-Open No. 20911/1984, Japanese Patent Publication No. 40188/1985, Japanese Patent Application Laid-Open No. 65351/1987, Japanese Patent Application Laid-Open No. 197541/1987 and Japanese Patent Application Laid-Open No. 146963/1988.

A PPS resin however has inferior adhesion to lead frames or bonding wires of electronic devices. When sealing is conducted with a PPS resin composition and the resultant sealed electronic device is placed in a high-humidity atmosphere, moisture tends to penetrate through the interfaces between the sealing resin and its lead frame or bonding wires so that the electrical insulating property may be reduced and/or the lead frame and wires may be corroded and the electrical characteristics of the electronic device may be reduced accordingly.

To cope with such a reduction in moisture resistance, it has been proposed to use a resin composition which is composed mainly of PPS and is blended with silicone oil or silicone rubber, for example, in Japanese Patent Application Laid-Open Nos. 37482/1986, 219145/1988, 219146/1988 and 219147/1988. Japanese Patent Application Nos. 114784/1980 and 38856/1981.

Electronic devices sealed with any of these sealing resin compositions still have insufficient moisture resistance, although some improvements in moisture resistance are observed. They also involve the bleeding problem of silicone oil. Insufficient moisture resistance and silicone oil bleeding have remained as problems to be solved before actual use.

OBJECTS AND SUMMARY OF THE INVENTION

An object of the invention is to provide an electronic device sealing resin composition having excellent moisture resistance.

Another object of the invention is to provide a sealed electronic device obtained using such an electronic device sealing resin composition as mentioned above, said composition having excellent moisture resistance.

The present inventors have carried out an extensive investigation with a view toward improving the moisture and bleed resistance of polyphenylene sulfide resin compositions blended with an epoxy-modified silicone oil of prior art, particularly, with the epoxy-modified silicone oil ("SF8411", trade name; product of Toray Silicone Co., Ltd.; epoxy equivalent: 3,000 g/eqiv.) disclosed in Japanese Patent Application Laid-Open No. 20911/1984. As a result, it has been found that the use of a resin composition composed of PAS as a thermoplastic resin, an inorganic filler blended in a high proportion to lower the coefficient of linear expansion of each resin portion and an epoxy-modified silicone oil having a specific epoxy equivalent is effective for the prevention of bleeding phenomenon of silicone oil and the improvement of adhesion between the resin composition and a lead frame and can provide excellent moisture resistance. These findings have led to the completion of the invention.

In one aspect of the invention, there is thus provided an electronic device sealing resin composition comprising 100 parts by weight of a thermoplastic resin mixture composed of 25-60 wt. % of a poly(arylene sulfide) (PAS) and 40-75 wt. % of an inorganic filler; and 1.5-5 parts by weight of an epoxy-modified silicone oil having an epoxy equivalent of 350-1,000 g/eqiv.

In another aspect of the invention, there is also provided a sealed electronic device obtained using such a resin composition.

DETAILED DESCRIPTION OF THE INVENTION

Features of the present invention will hereinafter be described in detail.

Poly(arylene sulfide)

PASs useful in the practice of the invention are polymers containing at least 50 wt. %, more preferably at least 70 wt. % of p-phenylene sulfide recurring units

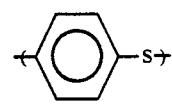

as predominant structural units thereof.

Lowly-crosslinked PAS polymers obtained using a crosslinking agent such as 1,2,4-trihalobenzene upon polymerization can also be used to extent not impairing the processability and physical properties.

Since p-phenylene sulfide units account for 50 wt. % or higher, the PAS may contain less than 50 wt. % of other copolymerizable structural units.

Examples of such structural units include m-phenylene sulfide units, diphenylsulfone sulfide units, diphenyl sulfide units, diphenyl ether sulfide units, 2,6-naphthalene sulfide units, etc.

Further, a block copolymer formed of 70-95 wt. % of p-phenylene sulfide recurring units and 5-30 wt. % of m-phenylene sulfide recurring units can also be used preferably.

Preferred as the PAS in the invention is that having a melting point higher than 250° C. If the melting point of the PAS is 250° C. or lower, the PAS cannot fully exhibit its characteristics as a heat-resistant resin.

In addition, as the PAS of the present invention, that having a melt viscosity of 10-500 poises, more preferably 20-200 poises as measured at 310° C. and the shear rate of 10,000 per second is desirable.

If the melt viscosity is less than 10 poises, separation tends to occur between an inorganic filler and the PAS in the composition upon sealing by molding and further, the sealed electronic device has reduced mechanical strength. Such low melt viscosities are therefore not preferred.

Where the PAS has high melt viscosity, a sealing resin composition having good physical properties can be obtained even when it is incorporated in a relatively large amount. A melt viscosity higher than 500 poises however results in a sealing resin composition whose melt viscosity becomes so high that fluidity and molding processability are both reduced and problems such as "device deplacement", "wire deformation" and the like may occur upon sealing by molding.

Such a PAS can suitably be obtained, for example, by the process disclosed in Japanese Patent Application Laid-Open No. 7332/1986.

Inorganic Filler

Exemplary inorganic fillers usable in the invention include particulate or powdery fillers such as silica, alumina, kaolin, clay, silica-alumina, titanium oxide, calcium carbonate, calcium silicate, calcium phosphate, calcium sulfate, magnesium carbonate, magnesium oxide, magnesium phosphate, silicon nitride, glass, hydrotalcite and zirconium oxide.

These inorganic fillers can be used either singly or in combination.

These inorganic fillers can also be used after treating them with a silane coupling agent or a titanate coupling agent.

Epoxy-Modified Silicone Oil

The epoxy-modified silicone oil employed in the invention is obtained by substituting epoxy-ring-containing organic groups for some organic groups bonded to silicon atoms of a polyorganosiloxane (silicone oil) such as polydimethylsiloxane or polymethylphenylsiloxane, in other words, by epoxy modification and has an epoxy equivalent, which shows the degree of modification, of 350-1,000 g/eqiv., preferably 400-700 g/eqiv.

The term "epoxy equivalent" as used herein indicates a molecular weight per unit number of epoxy groups contained in the molecular chain of the silicone oil. The larger the number of epoxy groups in the molecular chain, the smaller the epoxy equivalent.

When the epoxy equivalent is less than 350 g/eqiv, the proportion of epoxy groups in the epoxy-modified silicon oil increases. This results in a resin composition with reduced flexibility and lowered adhesion to lead frames, so that it is less effective for the improvement of the moisture resistance.

On the other hand, when the epoxy equivalent exceeds 1,000 g/eqiv., the proportion of epoxy groups in the epoxy-modified silicone oil becomes smaller. Accordingly, its compatibility with PAS is reduced, whereby the silicone oil tends to bleed out and at the same time the modulus of elasticity and strength of the resin composition show a marked reduction. It is thus not preferred to use the epoxy-modified silicone oil in proportions outside the above range.

Epoxy equivalents outside the range of 350-1,000 g/eqiv. cannot provide sealing compositions having excellent physical properties such as moisture resistance and strength.

In general, the viscosity of the epoxy-modified silicone oil in general can preferably range from 100 cSt to 20,000 cSt as measured at 25° C.

Proportions of Individual Components

Electronic device sealing resin compositions according to the invention are obtained by blending 1.5-5 parts by weight of an epoxy-modified silicone oil with 100 parts by weight of a thermoplastic resin mixture composed of 25-60 wt. % of a PAS and 40-75 wt. % of an inorganic filler.

Proportions of the inorganic filler smaller than 40 wt. % are too little to provide resin compositions having a sufficiently reduced coefficient of linear expansion, so that the resultant composition will undergo large thermal deformation at high temperatures and the resultant sealed and molded devices will be inferior in moisture resistance. If the inorganic filler is added in proportions greater than 75 wt. % on the other hand, the resulting resin compositions will have an increased viscosity so that they will have inferior moldability.

Proportions of the silicone oil smaller than 1.5 parts by weight are too small to provide resin portions having not only a sufficiently-lowered modulus of elasticity and but also a sufficient adhesion to lead frames so that the resultant sealed electronic devices will be inferior in moisture resistance. Proportions greater than 5 parts by weight will however result in sealing moldings of reduced mechanical strength and will undergo bleeding upon molding. It is thus not preferred to use the silicone oil in proportions outside the above range.

By using the above specific components in their respective proportions specified above, the invention can provide a sealing resin composition excellent in moisture resistance, flexural strength, etc.

The sealing composition of this invention can be blended with further synthetic resins, elastomers or anti-oxidants, heat stabilizers, light stabilizers, corrosion inhibitors, coupling agents, mold releasing agents, lubricants, colorants, foaming agents, flame retardants, antistatic agents and the like, as needed to extents not impairing the objects of this invention.

Examples of synthetic resins and elastomers include synthetic resins such as polyolefins, polyesters, polyamides, polyimides, polyetherimides, polycarbonates, polyphenylene ethers, polysulfones, polyethersulfones, polyetheretherketones, polyarylenes, plyacetals, polyethylene tetrafluoride, polyethylene difluoride, polystyrenes, ABS resins, epoxy resins, silicone resins, phenol resins and urethane resins; and elastomers such as polyolefin rubbers, fluorine rubbers and silicone rubbers.

The melt viscosity of the sealing resin composition of the present invention is in general 200–1,000 poises as measured at a temperature of 310° C. and a shear rate of 10,000/sec. When the melt viscosity is smaller than 200 poises, sealing moldings tend to develop cracks, thereby resulting in lowered moisture resistance. On the other hand, melt viscosities in excess of 1,000 poises tend to cause wire cutting or the like upon sealing by molding. Thus, it is not preferred to use the sealing resin composition having a melt viscosity outside the above range.

No particular limitation is imposed on the method for blending the individual components. For example, blending of the individual components in a mixer such as a Henschel mixer is widely practiced. No particular limitation is imposed either on the method for conducting the molding and sealing of an electronic device or the like with the resin composition of this invention.

ADVANTAGES OF THE INVENTION

According to the invention, electronic device sealing resin compositions which have improved adhesion to lead frames, show excellent moisture resistance and are free of silicone oil bleeding can be obtained by highly filling PAS with an inorganic filler to lower the linear expansion coefficient of the resin portion and at the same time, incorporating an epoxy-modified silicone oil having a specific epoxy equivalent. Electronic devices sealed by the sealing resin compositions are also provided.

EMBODIMENTS OF THE INVENTION

The invention will hereinafter be described specifically by the following Examples and Comparative Examples. It should however be borne in mind that the invention is not limited to the following Examples only.

Testing Methods of Physical Properties

With respect to sealed moldings obtained, physical property tests were conducted in accordance with the following methods.

Moisture Resistance Test

Testing method: Each sealed molding was placed in an atmosphere of 85° C. and 85% humidity for 24 hours. After the lead frame was alone dipped for 10 seconds in a solder bath of 260° C., the molding was immersed for 1 hour at 25° C. in a fluorescent ink (metal scar detective ink: product of Eishin Kagaku Co., Ltd.; "Neoglow-F-4A-E"). Then, using Sirdip Package Opener Model 00-032 (product of B&G Enterprises Corporation), TO-92 type transistor dummy was opened from the interface between the lead frame and the sealing resin, thereby observing the degree of penetration of the fluorescent ink at the interface between the sealing resin composition and the metal. The degree of penetration was ranked in accordance with the following standard.
A: Extremely small degree of penetration.
B: Small degree of penetration.
C: Medium degree of penetration.
D: Large degree of penetration.

Strength (Flexural Strength, Modulus of Flexural Elasticity) Test

A portion of pellets of each sealing resin composition was molded into test pieces (dimensions: 130 mm × 12.7 mm × 3.2 mm) at a cylinder temperature of 300° C. and a mold temperature of 150° C. by an injection molding machine ("IS-220E"; manufactured by Toshiba Machine Co., Ltd.), followed by measurements in accordance with ASTM D-790.

Surface Quality of Molded Devices

The degree of bleeding of the epoxy-modified silicone oil was visually inspected on the surface of each sealed molding and was also judged by the feeling to hand touch.
A: No bleeding.
B: Very little bleeding.
C: A little bleeding.
D: Substantial bleeding.

EXAMPLE 1

To 100 parts by weight of a thermoplastic resin composition obtained by blending 35 wt. % of poly-p-phenylene sulfide [melt viscosity $\eta^*$: 35 poises as measured at 310° C. and the shear rate of 10,000 sec$^{-1}$; melting point: 285° C.] and 65 wt. % of pulverized fused silica ("P-447K"; product of Nippon Electric Glass Co., Ltd.), 2.5 parts by weight of an epoxy-modified silicone oil ["XF-42-802"; product of Toshiba Silicone Co., Ltd.; viscosity; 1,720 cSt] having an epoxy equivalent of 460 g/eqiv. were intimately blended in a Henschel mixer. The resultant blend was extruded at a cylinder temperature of 300° C. into pellets by means of a twin-screw extruder having a screw diameter of 45 mm.

Using those pellets, copper lead frames were then sealed and molded by an injection molding machine ("IS-25EP-1YV", manufactured by Toshiba Machine Co., Ltd.) at a cylinder temperature of 300° C., a mold temperature of 200° C., an injection velocity of 20 cc/sec and a holding pressure of 400 kg/cm$^2$, thereby obtaining a dummy of a TO-92 type transistor (sealed molding).

The results of measurements of its physical properties are shown in Table 1.

EXAMPLES 2–4

In a similar manner to Example 1 except that the epoxy-modified silicone oil wa replaced by that having an epoxy equivalent of 650 g/eqiv. and a viscosity of 1,000 cSt in Example 2, that having an epoxy equivalent of 350 g/eqiv and a viscosity of 1,300 cSt in Example 3 and that having an epoxy equivalent of 750 g/eqiv. and a viscosity of 800 cSt in Example 4, sealed moldings and test pieces were prepared and then evaluated.

COMPARATIVE EXAMPLES 1–3

In a similar manner to Example 1 except that the epoxy-modified silicone oil was replaced by a commercial epoxy-modified silicone oil having an epoxy equivalent of 280 g/eqiv. and a viscosity of 27,000 cSt in Comparative Example 1, a commercial epoxy-modified silicone oil having an epoxy equivalent of 1,130 g/eqiv. and a viscosity of 470 cSt in Comparative Example 2 and a commercial epoxy-modified silicone oil having an epoxy equivalent of 3,000 g/eqiv. and a melt viscosity of 8,000 cSt in Comparative Example 3, sealed moldings and test pieces were prepared and then evaluated.

EXAMPLE 5

In a similar manner to Example 1 except that the proportion of the epoxy-modified silicone oil was changed to 5.0 parts by weight, sealed moldings and test pieces were prepared and then evaluated.

COMPARATIVE EXAMPLES 4-5

In a similar manner to Example 1 except that the proportion of the epoxy-modified silicone oil was changed to 1.0 part by weight in Comparative Example 4 and to 7.5 parts by weight in Comparative Example 5, sealed moldings and test pieces were prepared and then evaluated.

The results of the Examples and Comparative Examples are collectively shown in Table 1.

TABLE 1

|  | Examples |  |  |  |  | Comparative Examples |  |  |  |  |
|---|---|---|---|---|---|---|---|---|---|---|
|  | 1 | 2 | 3 | 4 | 5 | 1 | 2 | 3 | 4 | 5 |
| PAS (wt. %) | 35 | 35 | 35 | 35 | 35 | 35 | 35 | 35 | 35 | 35 |
| Silica (wt. %) | 65 | 65 | 65 | 65 | 65 | 65 | 65 | 65 | 65 | 65 |
| Epoxy-modified silicone oil |  |  |  |  |  |  |  |  |  |  |
| Epoxy equivalent (g/eqiv.) | 460 | 650 | 350 | 750 | 460 | 280 | 1130 | 3000 | 460 | 460 |
| blending amount (parts by weight) | 2.5 | 2.5 | 2.5 | 2.5 | 5.0 | 2.5 | 2.5 | 2.5 | 1.0 | 7.5 |
| Physical properties of composition |  |  |  |  |  |  |  |  |  |  |
| Flexural strength (kg/mm$^2$) | 4.8 | 4.3 | 5.2 | 4.0 | 4.6 | 5.8 | 3.5 | 3.2 | 5.2 | 4.4 |
| Modulus of flexural elasticity (kg/mm$^2$) | 990 | 920 | 1080 | 865 | 970 | 1192 | 818 | 800 | 1200 | 860 |
| Melt viscosity (poise) | 260 | 255 | 280 | 250 | 250 | 300 | 240 | 240 | 270 | 250 |
| Moisture resistance test | A | A | B | B | A | D | D | D | D | C |
| Surface quality of sealed molding | A | A | A | B | A | A | C | D | A | D |

EXAMPLES 6-7

In a manner similar to Example 1 except that the proportion of the pulverized fused silica was changed to 75 wt. % in Example 6 and to 60 wt. % in Example 7, sealed electronic devices and test pieces were molded and then evaluated.

EXAMPLE 8

In a similar manner to Example 1 except that magnesium oxide ("500W-10"; product of Asahi Glass Co., Ltd.) was used in a proportion of 65 wt. % as an inorganic filler, sealed electronic devices and test pieces were molded and then evaluated.

COMPARATIVE EXAMPLE 6

In a similar manner to Example 1 except that the proportion of the pulverized fused silica was changed to 80 wt. %, sealed moldings and test pieces were prepared and then evaluated.

COMPARATIVE EXAMPLE 7

In a similar manner to Example 1 except that an amino-modified silicone oil having an amino equivalent of 600 g/eqiv. was used as a substitute for the epoxy-modified silicone oil, sealed moldings and test pieces were prepared and then evaluated.

The results of Examples 6-8 and Comparative Examples 6-7 are collectively shown in Table 2.

TABLE 2

|  | Example |  |  | Comp. Ex. |  |
|---|---|---|---|---|---|
|  | 6 | 7 | 8 | 6 | 7 |
| PAS (wt. %) | 25 | 40 | 35 | 20 | 35 |
| Silica (wt. %) | 75 | 60 | — | 80 | 65 |
| Magnesium oxide (wt. %) | — | — | 65 | — | — |
| Modified silicone oil | epoxy | epoxy | epoxy | epoxy | amino |
| Modified equivalent (g/eqiv.) | 460 | 460 | 460 | 460 | 600 |
| blending amount (parts by weight) | 2.5 | 2.5 | 2.5 | 2.5 | 2.5 |
| Physical properties of composition |  |  |  |  |  |
| Flexural strength (kg/mm$^2$) | 4.5 | 4.9 | 4.7 | — | 3.3 |
| Modulus of flexural elasticity (kg/mm$^2$) | 1370 | 870 | 1326 | — | 897 |
| Melt viscosity (poise) | 840 | 220 | 410 | 1400 | 300 |
| Moisture resistance test | A | A | A | D | D |
| Surface quality of sealed molding | A | A | A | D | D |

EXAMPLE 9

In a similar manner to Example 1 except that the poly-p-phenylene sulfide was replaced by that having a melt viscosity of 180 poises as measured at the temperature of 310° C. and the shear rate of 10,000/sec and the proportions of the individual components in the composition were changed as shown in Table 3, sealed moldings and test pieces were prepared and then evaluated.

COMPARATIVE EXAMPLE 8

In a similar manner to Example 1 except that the poly-p-phenylene sulfide was replaced by that of Example 9 and the proportions of the individual components in the composition were changed as shown in Table 3, sealed moldings and test pieces were prepared and then evaluated.

The results of Example 9 and Comparative Example 8 are collectively shown in Table 3.

TABLE 3

|  | Example 9 | Comp. Ex. 8 |
|---|---|---|
| PAS (wt. %) | 60 | 70 |
| Silica (wt. %) | 40 | 30 |
| Epoxy-modified silicone oil* (parts by weight) | 3.5 | 3.5 |
| Physical properties of composition |  |  |
| Flexural strength (kg/mm$^2$) | 7.1 | 7.0 |
| Modulus of flexural elasticity (kg/mm$^2$) | 530 | 481 |
| Melt viscosity (poise) | 500 | 410 |
| Moisture resistance test | A | D |
| Surface quality of molded product | A | A |

Note)
*epoxy equivalent = 460 (g/eqiv.)

We claim:

1. An electronic device sealing resin composition comprising 100 parts by weight of a thermoplastic resin mixture composed of 25-60 wt. % of a poly(arylene sulfide) and 40-75 wt. % of an inorganic filler; and 1.5-5 parts by Weight of an epoxy-modified silicone oil having an epoxy equivalent of 350–1,000 g/eqiv.

2. The composition of claim 1, wherein the poly(arylene sulfide) is a polymer which has at least 50 wt. % of the recurring units of the formula

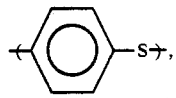

has a melting point of 250° C. or higher and has a melt viscosity of 10–500 poises as measured at 310° C. at a shear rate of 10,000/sec.

3. The composition of claim 1, wherein the epoxy-modified silicone oil has an epoxy equivalent of 400–700 g/eqiv.

4. The composition of claim 1, wherein the viscosity of the resin composition is in a range of from 200 to 1,000 poises as measured at 310° C. at a shear rate of 10,000/sec.

5. An electronic sealed device sealed using the composition of claim 1.

* * * * *